(12) United States Patent
Cho et al.

(10) Patent No.: US 7,433,995 B2
(45) Date of Patent: Oct. 7, 2008

(54) METHOD FOR UPDATING MEMORY

(75) Inventors: Hae-jin Cho, Seoul (KR); Hyoung-Yoon Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 223 days.

(21) Appl. No.: 11/325,779

(22) Filed: Jan. 4, 2006

(65) Prior Publication Data

US 2006/0179367 A1    Aug. 10, 2006

(30) Foreign Application Priority Data

Jan. 5, 2005    (KR) .................. 10-2005-0000886

(51) Int. Cl.
*G06F 12/00* (2006.01)
*G11C 29/00* (2006.01)
*G06F 13/00* (2006.01)

(52) U.S. Cl. ................ 711/103; 711/100; 711/154

(58) Field of Classification Search ............... 711/100, 711/141, 103, 154; 714/36, 766; 365/185.33
See application file for complete search history.

(56) References Cited

U.S. PATENT DOCUMENTS

| 5,748,537 | A  | * | 5/1998 | Garbers et al. | ......... 365/185.33 |
| 6,715,106 | B1 | * | 3/2004 | Mermelstein | ................ 714/36 |
| 2004/0049727 | A1 | * | 3/2004 | Wang | .......................... 714/766 |
| 2004/0186962 | A1 | * | 9/2004 | Polyudov | ..................... 711/141 |

* cited by examiner

*Primary Examiner*—Tuan V. Thai
(74) *Attorney, Agent, or Firm*—Lee, Hong, Degerman, Kang & Schmadeka

(57) ABSTRACT

A method for updating a memory is disclosed to increase a memory update rate. The method for updating a memory includes detecting a memory block to be updated among a plurality of memory blocks of a memory; and updating only the detected memory block.

18 Claims, 3 Drawing Sheets

| ADDRESS OF EACH BLOCK | | EACH CRC VALUE |
|---|---|---|
| FIRST | 0x0000 | 0x2323 2323 |
| SECOND | 0x0001 | 0x4545 4545 |
| THIRD | 0x0002 | 0x5656 5656 |
| ⋮ | ⋮ | ⋮ |
| n-1 | 0x0032 | 0x1232 32412 |

INFORMATION STORED IN NTH BLOCK

METHOD FOR UPDATING MEMORY

Pursuant to 35 U.S.C. § 119(a), this application claims the benefit of earlier filing date and right of priority to Korean Patent Application No(s). 10-2005-0000886 filed on Jan. 5, 2005, which is hereby incorporated by reference herein in their entirety.

BACKGROUND OF THE INVENTION

1. Field of the Invention

The present invention relates to a memory and, more particularly, to a method for updating a memory.

2. Description of the Related Art

In general, mobile communication terminals include a personal digital assistant (PDA), a smart phone, and the like. The mobile communication terminals need a large capacity of memory as it uses multimedia data.

A related art method for updating a memory of a mobile communication terminal is that an entire memory region (entire memory blocks) of a flash memory within a mobile terminal is erased and a new version of ROM data and firmware data are written.

For example, it takes about 15 seconds to erase specific memory blocks (e.g., 256 Kbyte) of a NOR flash memory and newly update the specific memory blocks. However, when the new version of ROM data and firmware are updated, the entire data stored in the memory blocks need not to be updated. In other words, in the related art memory updating method, although a portion of the entire data stored in the entire memory blocks needs to be updated, the entire data stored in the entire memory is unnecessarily updated, lengthening time for updating the memory.

BRIEF DESCRIPTION OF THE INVENTION

Therefore, an object of the present invention is to provide a method for updating a memory capable of enhancing a memory update rate.

To achieve these and other advantages and in accordance with the purpose of the present invention, as embodied and broadly described herein, there is provided a method for updating a memory comprising: detecting a memory block to be updated among a plurality of memory blocks of a memory; and updating only the detected memory block.

To achieve the above object, there is also provided a method for updating a memory comprising: determining a memory block corresponding to a specific block address mapped to a first specific CRC (Cyclic Redundancy Check) value as a memory block to be updated, when the first specific CRC value of a plurality of first CRC values of first data stored in memory blocks of a first memory is not identical to a second specific CRC value of a plurality of second CRC values of second data stored in a second memory; and updating the determined memory block.

To achieve the above object, there is also provided a method for updating a memory comprising: comparing first CRC values of first ROM (Read Only Memory) data and/or firmware data stored in memory blocks of a first memory and second CRC values of second ROM data and/or firmware data stored in a second memory; determining a memory block where a first specific CRC value is stored as a memory block to be updated, when the first specific CRC value of the plurality of first CRC values is not identical to a second specific CRC value of the plurality of second CRC values; erasing only data stored in the determined memory block; and writing the second ROM data and/or firmware data stored in the memory block where the second specific CRC value is stored in the determined memory block.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

The method for updating a memory capable of enhancing a rate of updating a memory by detecting a memory block to be updated among a plurality of memory blocks of a memory and updating only the detected memory block.

Figures 1, 2:
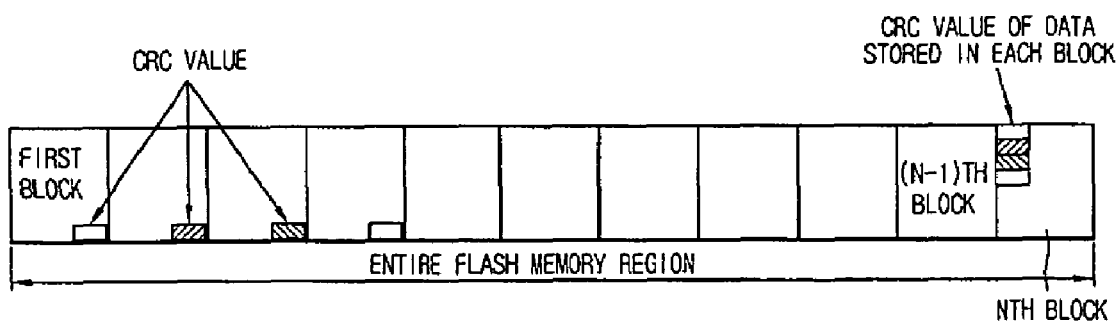
FIG. 1 illustrates the structure of a flash memory for explaining the present invention.
FIG. 2 is an exemplary view showing mapped information recorded in the nth memory block of the flash memory in FIG. 1.

FIG. 1 illustrates the structure of a flash memory for explaining the present invention.

As shown in FIG. 1, a flash memory includes 'n' number of memory blocks. Data (e.g., ROM data (ROM image) and/or firmware data) and CRC values can be stored from the first (first block) to (n−1)th memory blocks. Herein, the ROM data and/or firmware data are stored in the flash memory by block unit.

A CRC value of data stored in each memory block (the first to (n−1)th blocks) is stored in the nth memory block of the flash memory. Accordingly, when the ROM data and/or firmware data is/are stored in the flash memory, a CRC value of data stored in each memory block is extracted, a block to be updated is detected based on the extracted CRC value, and the detected block is updated. Herein, the information obtained by mapping an address of each memory block with the CRC values of the data stored in each memory block can be stored in the nth memory block of the flash memory.

FIG. 2 is an exemplary view showing mapped information recorded in the nth memory block of the flash memory in FIG. 1.

As shown in FIG. 2, the information obtained by mapping the address of each memory block with the CRC values of data stored in each memory block is stored in the nth memory block of the flash memory. For example, information obtained by mapping an address of each memory block with a CRC value of data stored in each memory such as 0x0000: 0x2323 2323, 0x0001:0x4545 4545, 0x0002:0x5656 5656, . . . , 0x0032:0x1232 32412 is stored in the nth memory block of the flash memory.

The method for updating a memory in accordance with the present invention applied for a mobile communication terminal will now be described with reference to FIG. 3.

Figure 3:
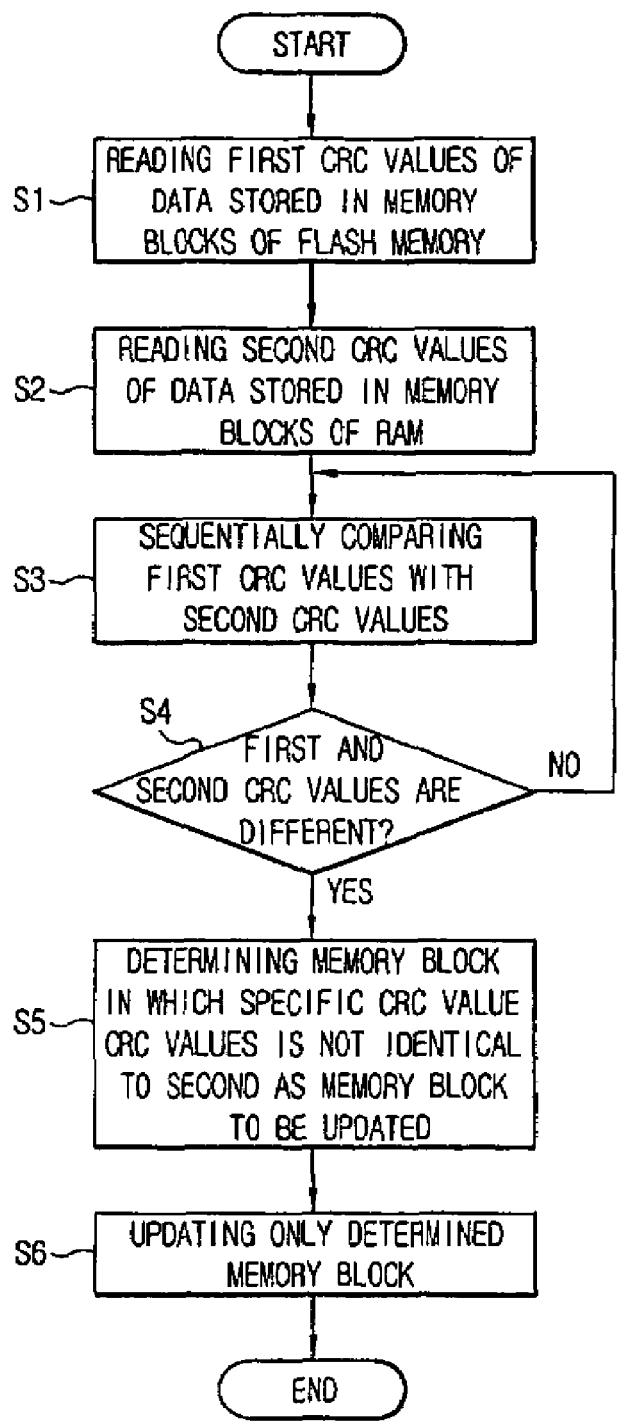
FIG. 3 is a flow chart illustrating the processes of a method for updating a memory in accordance with the present invention.

FIG. 3 is a flow chart illustrating the processes of a method for updating a memory in accordance with the present invention.

First, when a new version of ROM data and/or firmware data is received, a ROM update utility of a mobile communication terminal stores the new version of ROM data and/or firmware data in a RAM of the mobile communication terminal.

A boot loader of the mobile communication terminal reads first block information stored in the last memory block (e.g., the nth memory block) of the flash memory of the mobile communication terminal (step S1), and reads second block information stored in the last memory block (e.g., the nth memory block) of the RAM of the mobile communication terminal (step S2). Herein, the first block information refers to the information obtained by mapping the addresses of the memory blocks of the flash memory with the first CRC values of the data (old version of ROM data and/or firmware data) stored in the memory blocks of the flash memory in a one-to-one manner, and the second block information refers to the information obtaining by mapping the addresses of the memory blocks of the RAM with the second CRC values of the data (new version of ROM data and/or firmware data) stored in the memory blocks of the RAM in the one-to-one manner.

The boot roader compares the read first CRC values of the first block information and the read second CRC values of the second block information (step S3). When a CRC value of data stored in a specific memory block of the flash memory (e.g., a third memory block of the flash memory) is not identical to a CRC value of data stored in a specific memory block stored in the RAM (e.g., a third memory block of the RAM) (step S4), the boot loader determines the specific memory block of the flash memory (e.g., the third memory block of the flash memory) as a memory block to be updated (step S5), and updates data stored in the determined memory block to be updated with data stored in the specific memory block stored in the RAM. Namely, the boot roader erases the data stored in the third memory block of the flash memory and writes the data stored in the third memory block stored in the RAM in the third memory block of the flash memory (step S6).

Figure 4:
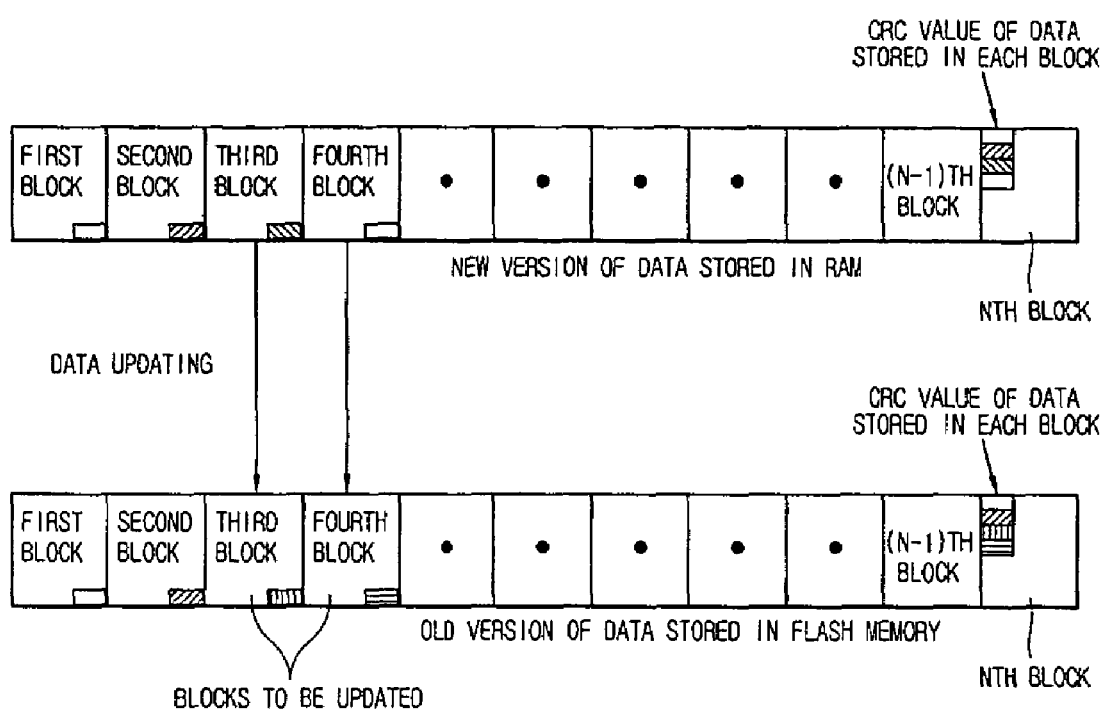
FIG. 4 is an exemplary view a process of comparing CRC values stored in memory blocks and updating a specific block according to a comparison result according to the method for updating a memory in accordance with the present invention.

FIG. 4 is an exemplary view a process of comparing CRC values stored in memory blocks and updating a specific block according to a comparison result according to the method for updating a memory in accordance with the present invention.

As shown in FIG. 4, the boot roader sequentially compares the first CRC values stored in the last memory block of the flash memory and the second CRC values stored in the last memory block of the RAM, and determines memory blocks to be updated based on the comparison result.

For example, the boot roader sequentially compares CRC values from the first memory to the (n−1)th memory block as stored in the last memory block of the flash memory, and the CRC values from the first memory block to the (n−1)th memory block as stored in the last memory block of the RAM.

If CRC values of data stored in the third and fourth memory blocks of the flash memory are not identical to CRC values of data stored in the third and fourth memory blocks stored in the RAM, the boot roader determines the third and fourth memory blocks of the flash memory as memory blocks to be updated based on the addresses of the third and fourth memory blocks of the flash memory.

Thereafter, the boot roader erases data stored in the third and fourth memory blocks of the flash memory, and writes the data stored in the third memory stored in the RAM in the third memory block of the flash memory and also writes the data stored in the fourth memory block stored in the RAM in the fourth memory block of the flash memory. Herein, the address of the third memory block of the flash memory and the address of the third memory block of the RAM are the same. Namely, the memory blocks of the flash memory and the memory blocks of the RAM have the same addresses.

The memory updating method in accordance with the present invention can be applied for various types of memories as well as for the flash memory.

As so far described, the memory updating method in accordance with the present invention has the advantage that the memory updating rate can be increased by detecting a memory block to be updated among a plurality of memory blocks within the memory and updating only the detected memory block.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A method for updating a memory comprising:
   detecting a memory block to be updated from among a plurality of memory blocks of the memory; and
   updating only the detected memory block,
   wherein detecting the memory block to be updated comprises comparing first CRC values of previous data stored in the plurality of memory blocks with second CRC values of new data and determining a memory block in which a first specific CRC value is stored as the memory block to be updated, when the first specific CRC value among the first CRC values is not identical to a second specific CRC value of the second CRC values, such that the memory block in which the first specific CRC value is stored and the memory block in which the second specific CRC value is stored have the same address.

2. The method of claim 1, wherein the memory is a flash memory.

3. The method of claim 1, wherein the data updated in the detected memory block is at least one or more of ROM (Read Only Memory) data and firmware data.

4. The method of claim 1, wherein, in the step of detecting the memory block, the memory block to be updated is detected based on each memory block information stored in a specific memory block of the memory.

5. The method of claim 4, wherein the specific memory block is the last memory block of the plurality of memory blocks.

6. The method of claim 4, wherein each memory block information refers to information obtained by mapping an address of each memory block with a CRC (Cyclic Redundancy Check) value of data stored in each memory block.

7. The method of claim 4, wherein each memory block information is a CRC value of data stored in each memory block.

8. The method of claim 1, wherein the new data is stored in the second memory.

9. The method of claim 8, wherein the second memory is a RAM (Random Access Memory).

10. A method for updating a memory comprising:
comparing first CRC values of first ROM (Read Only Memory) data or firmware data stored in memory blocks of a first memory and second CRC values of second ROM data or firmware data stored in a second memory;
determining a memory block where a first specific CRC value is stored as a memory block to be updated, when the first specific CRC value of the plurality of first CRC values is not identical to a second specific CRC value of the plurality of second CRC values;
erasing only data stored in the determined memory block; and
writing the second ROM data or firmware data stored in the memory block where the second specific CRC value is stored in the determined memory block.

11. The method of claim 10, wherein the first memory is a flash memory.

12. The method of claim 11, wherein the flash memory is installed in a mobile communication terminal.

13. The method of claim 10, wherein the second memory is a RAM of the mobile communication terminal.

14. The method of claim 10, wherein the first CRC values are stored in the last memory block of the first memory.

15. The method of claim 10, wherein the second CRC values are stored in the last memory block of the second memory.

16. The method of claim 10, wherein the first CRC values are mapped with an address of each memory block of the first memory.

17. The method of claim 10, wherein the first ROM data or firmware data is an old version and the second ROM data or firmware data is a new version.

18. A method for updating a memory comprising:
determining a memory block corresponding to a specific block address mapped to a first specific CRC (Cyclic Redundancy Check) value as a memory block to be updated, when the first specific CRC value of a plurality of first CRC values of first data stored in memory blocks of a first memory is not identical to a second specific CRC value of a plurality of second CRC values of second data stored in a second memory; and
updating the determined memory block.

* * * * *